United States Patent [19]
Nichani et al.

[11] Patent Number: 5,949,905
[45] Date of Patent: Sep. 7, 1999

[54] MODEL-BASED ADAPTIVE SEGMENTATION

[76] Inventors: Sanjay Nichani, 39 Auburn St. #6, Framingham, Mass. 01701; Joseph Scola, 12 Hilltop Cir., Medfield, Mass. 02052

[21] Appl. No.: 08/735,628

[22] Filed: Oct. 23, 1996

[51] Int. Cl.⁶ .................................................. G06K 9/34
[52] U.S. Cl. ......................... 382/173; 382/171; 382/172; 382/271
[58] Field of Search .................................. 382/171, 172, 382/173, 197, 209, 271, 272

[56] References Cited

U.S. PATENT DOCUMENTS

| | | | |
|---|---|---|---|
| 4,731,863 | 3/1988 | Sezan et al. | 382/51 |
| 4,876,457 | 10/1989 | Bose | 250/563 |
| 5,054,100 | 10/1991 | Tai | 382/47 |
| 5,153,925 | 10/1992 | Tanioka et al. | 382/52 |
| 5,212,740 | 5/1993 | Paek et al. | 382/22 |
| 5,311,598 | 5/1994 | Bose et al. | 382/8 |
| 5,325,443 | 6/1994 | Beatty et al. | 382/8 |
| 5,436,979 | 7/1995 | Gray et al. | 382/141 |
| 5,481,620 | 1/1996 | Vaidyanathan | 382/169 |
| 5,495,535 | 2/1996 | Smilansky et al. | 382/145 |
| 5,638,465 | 6/1997 | Sano et al. | 382/281 |

OTHER PUBLICATIONS

Automated Vision System for Inspection of IC Pads and Bonds, Sreenivasan et al., *IEEE Transactions on Components, Hybrids, and Manufacturing Technology*, pp. 335–338, vol. 16, No. 3, May 1993.

Discrimination of Planar Shapes Using Shape Matrices, Taza et al. *IEEE Transactions on Systems, Man, and Cybernetics*, pp. 1281–1289, vol. 19, No. 5., Oct. 1989.

Subpixel Image Registration Using Circular Fiducials, Efrat et al., *IEEE*, pp. 49–58, 1993.

*Primary Examiner*—Phuoc Tran
*Attorney, Agent, or Firm*—Russ Weinzimmer

[57] ABSTRACT

A machine vision method is provided for segmenting an image based on an adaptive thresholding approach that exploits prior knowledge of the characteristics, such as area, of the object to be segmented. Adaptation to varying gray-values of the candidate object/background from scene-to-scene is obtained by using a sampling window which provides gray-value statistics of the candidate object to be segmented. Next, using these statistics, a characteristic of the image of the object to be segmented, such as its area or its gray-value standard deviation, and the histogram of the image, the segmentation is performed. The invention is especially useful for detecting the presence/absence of adhesive on printed circuit boards, where both the appearance of the printed circuit board and the solder paste commonly found thereon make segmentation difficult. In case of presence/absence determination, an additional step of shape matching is employed.

10 Claims, 6 Drawing Sheets

MODEL-BASED ADAPTIVE SEGMENTATION

FIELD OF THE INVENTION

This invention relates generally to machine vision, and particularly to image segmentation, object identification, defect detection, and object presence/absence determination.

BACKGROUND OF THE INVENTION

In automated manufacturing, it is often important to determine the location, shape, size, and/or angular orientation of an object being processed or assembled. The definition of "object" depends on the task at hand. For example, for inspecting the presence/absence/quality of adhesive being printed on a printed circuit board, adhesive is the "object". For inspecting the presence/absence/quality of solder paste on a printed circuit board, solder paste is the "object". In general, an "object" is defined herein as a feature of interest, and everything else is called the "background".

Although a human eye can readily distinguish between objects in an image, this has not historically been the case for machine vision systems. In the field of machine vision, the task of analyzing an image to isolate and identify the features of interest is a process referred to as "segmentation". In the example of "adhesive inspection" on a printed circuit board, image segmentation can be employed to identify the pixels in the image that represent regions of adhesive, i.e., "object" regions, as well as those pixels that represent all other features (printed circuit board, traces, pads, ground planes, etc.) i.e., "background" regions. By assigning different pixel values to object and background regions, respectively, such as "1" to pixels that represent object regions and "0", to pixels that represent background regions, image segmentation can facilitate subsequent analysis of the image by other machine vision tools, such as "connectivity analysis". Connectivity analysis can be employed to isolate the objects in a segmented image by identifying their component pixels, particularly, by identifying those object pixels that are connected to each other by virtue of horizontal, vertical, or diagonal adjacency.

The prior-art includes a number of techniques for segmenting an image. For example, "thresholding" can be used to distinguish an object from the background by classification of pixel gray-values in an image of the object. In the example above, thresholding can be used to segment object from background by finding an appropriate gray-value that distinguishes each pixel of the object from each pixel of the background. Other more complex thresholding techniques are required for images that cannot be segmented using a single static threshold.

A threshold value can be static (i.e., fixed) if, for all images of the parts being inspected, the object gray-values are distinguishable from the background gray-values (i.e., there is no single gray-value that is associated with both an object region and a background region). However, if this condition is not satisfied, then a dynamic/adaptive thresholding technique is required. Typically, these techniques are histogram-based.

A gray-value histogram of an image is a function that gives the number of pixels of each gray-value in the image. If the gray-values v are quantized from 0 to n, then the histogram value at a particular gray-value v (between 0 and n) is denoted by h(v), for example.

In a simple adaptive thresholding scheme, called "relative mapping", the threshold corresponds to the gray-value below which the gray-value of a certain fixed percentage of pixels fall, where the fixed percentage of pixels corresponds to a fixed area under the histogram curve. More complex adaptive thresholding techniques could be constructed, for example, by assuming that the histogram is bi-modal (i.e., has two peaks), and therefore finding a suitable threshold is straightforward once the predominant gray-value of each peak is found. The dynamic threshold can be placed at the half-way point between the two peaks, or at a minimum point between the two peaks.

Although the adaptive segmentation techniques described above are useful in isolating objects in the context of a simple background, they are of limited value in identifying objects surrounded by complex backgrounds. This situation typically arises in the case of segmenting images to detect the presence/absence of adhesive on a printed circuit board, and in the case of segmenting images to perform defect detection on the surface of a semi-conductor die, for example. It must be noted that presence/absence determination and defect detection is an inherent result of a segmentation analysis. This can be understood by recognizing that if the object is absent, or if there are no defects, segmentation should reveal no objects and only background. Otherwise, segmentation should reveal the feature of interest or the defects in the image as, for example, a cluster of 1's against a background of 0's.

It is known to use golden template comparison (GTC) to aid in segmenting complicated images such as images of objects having a complex background. GTC is a technique for locating defects by comparing a test image of a feature under scrutiny to a good image called a "golden template. Before a GTC inspection can be performed, a golden template must be trained and stored in memory. Further, to compare the test image with the golden template, the test image must be precisely registered with respect to the golden template. In some applications, it can be overly burdensome to perform the training step necessary to obtain a golden template, and to ensure that precise registration is achieved. Moreover, the GTC technique is useful primarily in applications where the production process under analysis is very repeatable. However, in the case of some applications, conditions can vary, such as in the case of adhesive inspection on printed circuit boards, wherein board color varies, adhesive color varies, and other features such as pads, masks, and traces may not have the exact same size from board to board, thereby making GTC difficult to use.

Another technique that can be used for adhesive inspection is to capture two images and compare them: one image taken before the adhesive is applied, and one image taken after the adhesive is applied. This technique eliminates some of the problems that are encountered with GTC, explained above. However, capturing two images at different times increases the cycle time of the inspection, while also complicating mechanical handling of the object under inspection. Also, the problem of registration still needs to solved, where here the two images to be compared must be precisely registered with respect to each other.

SUMMARY OF THE INVENTION

The invention provides, in one aspect, a machine vision method for segmenting an image. The method for segmenting an image is based on adaptive thresholding and prior knowledge of a characteristic of a model image of an object to be inspected, such as the area of an image of the object (model object region) in the model image, or the standard deviation of the gray-values of the pixels within a selected portion of the model object region, i.e., of the image of the object in the model image. Adaptation to varying gray-values of the object to be segmented and its background from scene to scene is achieved using a sampling window which provides gray-value statistics of the pixels within a selected portion of the image of the object to be segmented. A gray-value statistic, such as the mean (average) gray-value, is used as a starting point on the histogram of the image to be segmented. In one aspect of the invention, a "histogram walking" approach is used to derive two thresholds; one threshold on each side of the starting point. The two thresholds derived in this way are determined such that the area below the histogram curve and within the two thresholds is equal to the area of the image region corresponding to the object being segmented. Once the two thresholds are obtained, they can be used to perform segmentation. All pixels with a gray-value that falls between the two thresholds most likely correspond to the object of interest, and all other pixels most likely correspond to the background.

In an alternate embodiment, after the gray-value statistic, such as the mean (average) gray-value, is used as a starting point on the histogram of the image to be segmented, the standard deviation of the gray-values of the pixels within the area of the model object region is computed and used as a basis for determining the two thresholds. Other gray-value statistics, such as the median or mode, can be used in place of the mean.

In other aspects of the invention, to perform a presence/absence determination, an additional step of shape matching is employed after segmentation to compare the segmented object to the object of interest. This comparison is achieved by feature matching, i.e., matching geometric features of the known object to geometric features of the segmented object, and/or can be achieved by template matching of the known object to the segmented object, using binary correlation, for example. A high degree of matching of either the geometric features and/or the template indicates the presence of the object.

The invention provides improved methods for machine image segmentation. The invention also provides methods that can be used for determining the presence/absence of objects. One benefit of the invention is that it can be used to segment and inspect both repeatable and non-repeatable images. A further benefit of the invention is that it can be used to segment and inspect scenes where the background gray-values and the object gray-values significantly vary from image to image. The invention also provides segmenting and inspecting methods that require only simplified training so as to minimize user interaction and improve inspection time, while reducing mechanical handling as compared with the methods of the prior art.

BRIEF DESCRIPTION OF THE DRAWINGS

The invention will be more fully understood from the following detailed description, in conjunction with the accompanying figures, wherein.

DETAILED DESCRIPTION OF THE FIGURES

Figure 1:
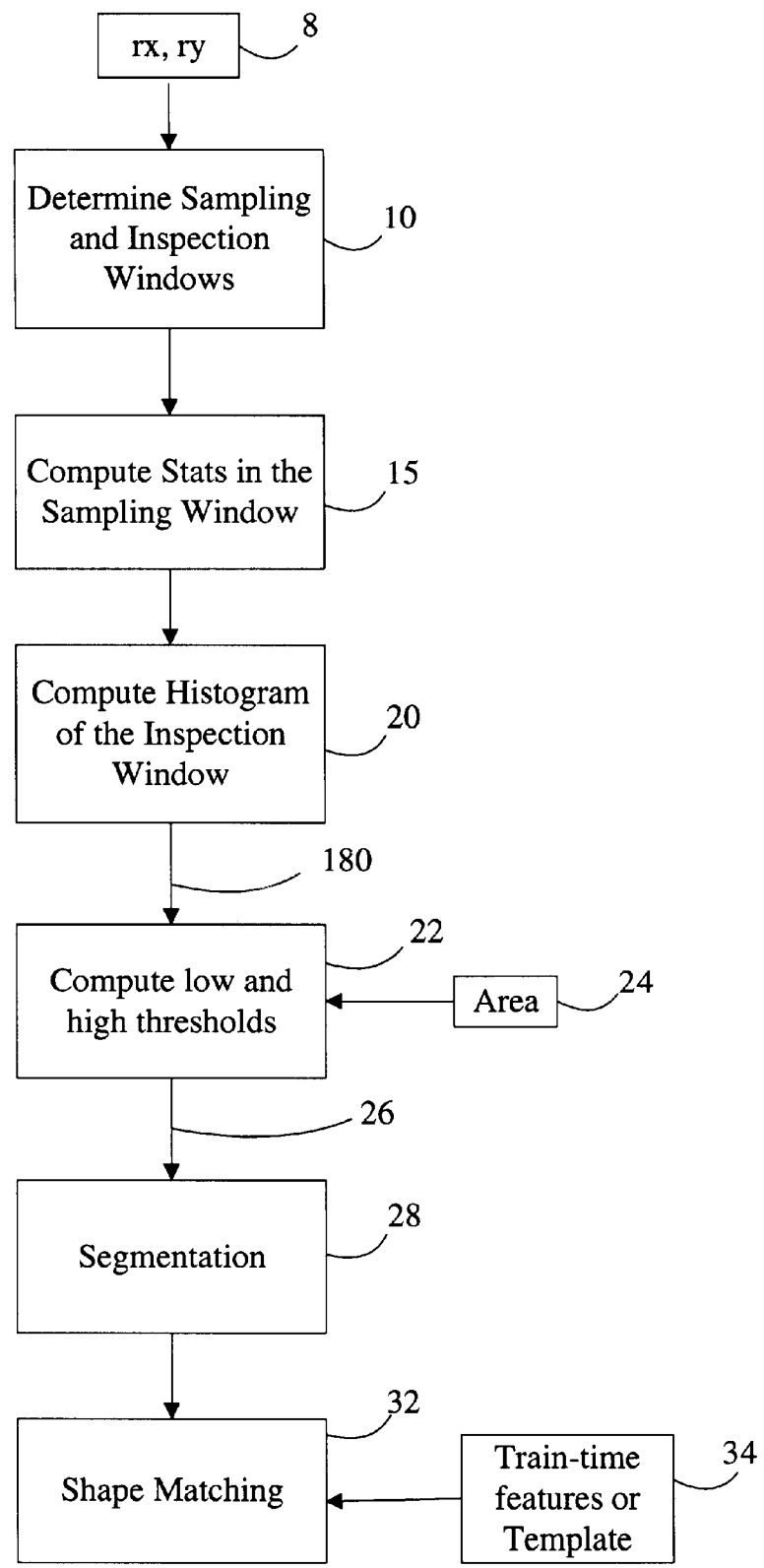
FIG. 1 is a flow chart showing the run-time portion of the method of the invention.
Figure 4:
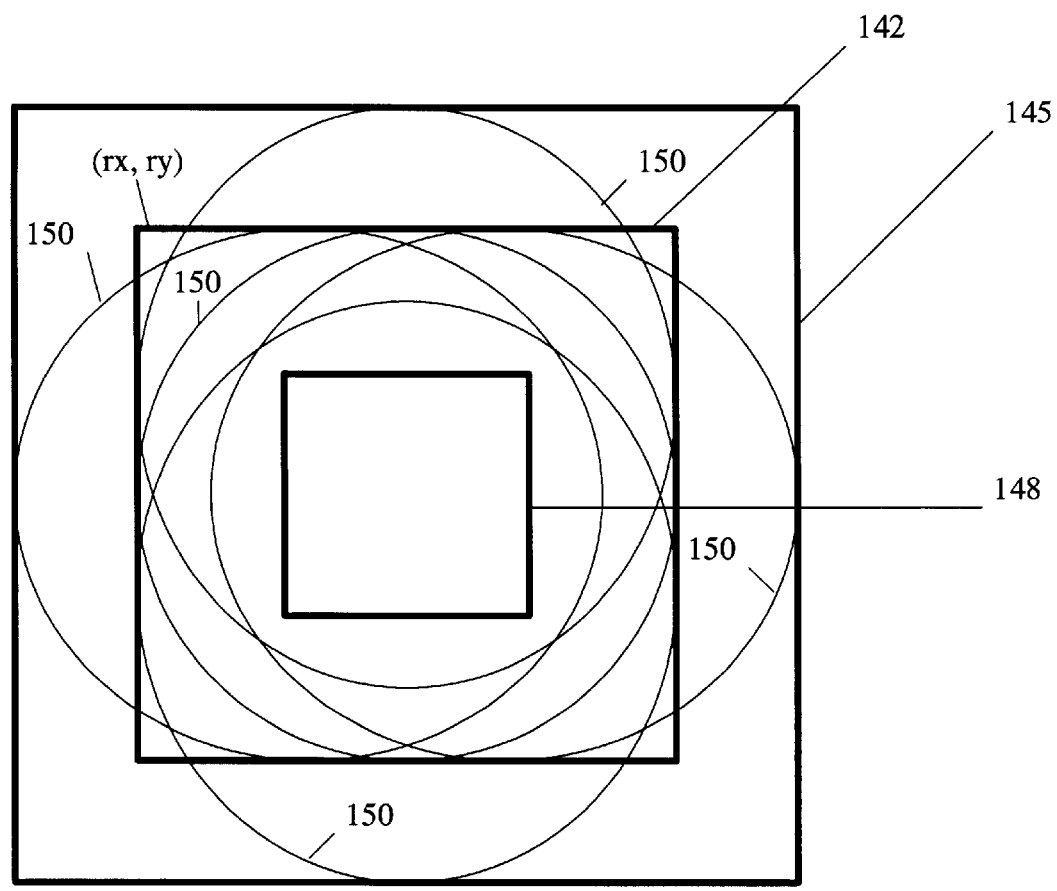
FIG. 4 is a drawing showing three run-time inspection windows, and a number of possible positions of adhesive relative to the windows.

The invention is described in greater detail by using the example of adhesive inspection on printed circuit boards. With reference to FIGS. 1 and 4, (where each method step is denoted by a reference number in parentheses) at run-time, prior to the adhesive inspection, an alignment is performed to locate the global fiducials on the printed circuit board to be inspected. Once the fiducials are located, and using the known train-time positions (tx, ty) of the inspection sites with respect to the fiducials, the run-time coordinates (rx, ry) of the inspection sites are determined (8) using a "pseudo-inverse rigid body transformation", as explained below. The width and height of the run-time window (rh, rw) are preferably the same as the width and height (th, tw) of the train-time window. The inspection window 145 and sampling window 148, as shown in FIG. 4, are then determined (10) using the run-time inspection site positions rx and ry, and the width and height (rh, rw) of the run-time window 142, as explained below. The inspection window 145 is sized and positioned so as to completely encompass the expected adhesive area, shown by the plurality of possible adhesive positions 150, and the sampling window 148 is sized and positioned so as to guaranteed that it will fall within the expected adhesive area, regardless of minor variations 150 in position of the adhesive on the printed circuit board.

Next, the statistics of the sampling window 148 are computed (15), preferably the mean of the gray-values of the pixels within the sampling window 148. In alternate embodiments, the median gray-value or the mode of the gray-values, or any other unique and significant value that can be used to characterize a statistical distribution, can be used.

Next, the histogram 180 of the inspection window 145 is computed (20). Then, preferably using the mean computed in step (15), the histogram of the inspection window 145, and the area of the adhesive (24), the two thresholds 26 are computed, i.e., a low threshold and a high threshold, such that the two thresholds 26 and the histogram 180 enclose a number of pixels equal to the area in pixels of the image of the adhesive. The area of the adhesive (24) can be the a priori knowledge of the area used at the train-time step (64), or it can preferably be a more refined and adaptive value based on the segmentation and extract features steps (68 and 70) of train-time. The two thresholds are preferably equidistant from the mean pixel value computed in step 15. Alternatively, in some applications characterized by an asymmetric distribution, it can be preferable to adopt an asymmetric histogram walking scheme.

Once the two thresholds 26 are derived, they are used to perform segmentation (28): all pixels having a gray-value between the two thresholds are deemed to correspond to the object of interest, and all other pixels are deemed to correspond to background.

The present application of inspecting adhesive on a printed circuit board involves detecting the presence and absence of adhesive using an additional step of shape matching (32) to compare the run-time geometric features of the segmented adhesive with train-time geometric features 34 of the model image of an adhesive region. One suitable way to obtain the run-time geometric features is to use a standard, off-the-shelf connectivity-based analysis vision tool, such as a blob analysis tool, as is well-known in the art.

Another method for performing the step of shape matching 32 is to use template matching, such as by creating a model template of a known adhesive region, and using binary correlation, normalized correlation, or sum-of-absolute-differences as match metrics to quantify the extent of matching of the model image to the run-time image of the adhesive.

Figure 2:
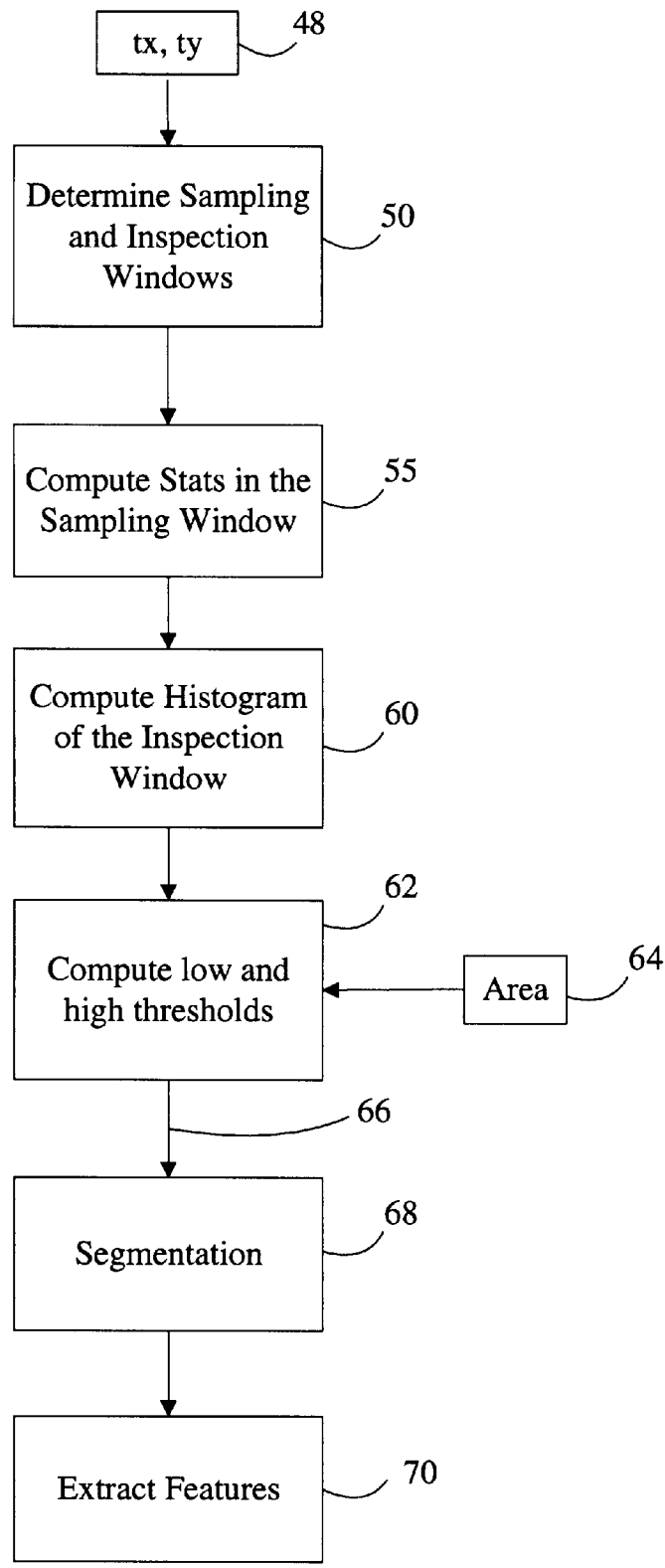
FIG. 2 is a flow chart showing the train-time portion of the method of the invention.
Figure 3:
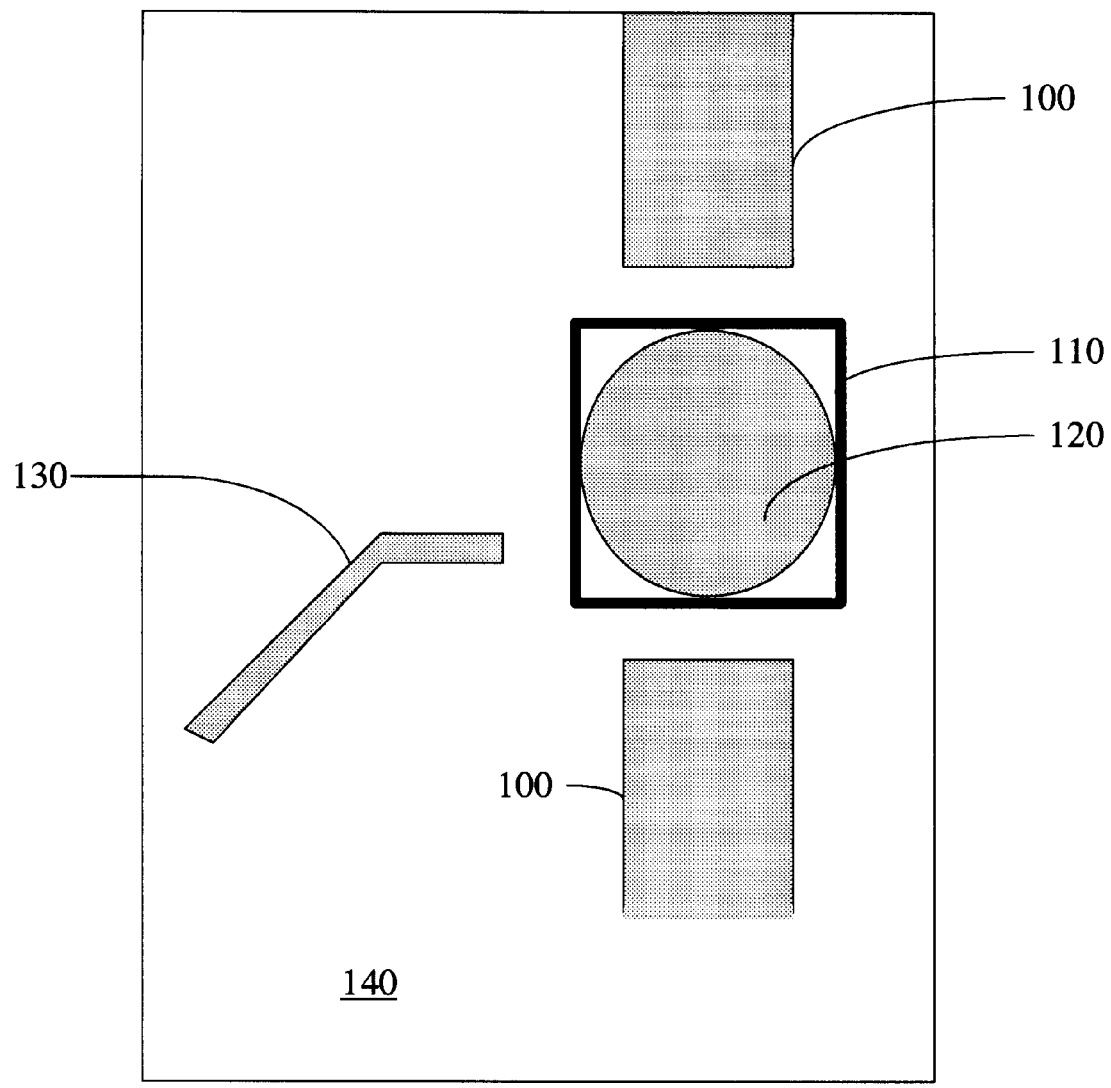
FIG. 3 is a plan view of a printed circuit board showing a printed circuit board having pads, traces, and a typical site for placing adhesive.
Figure 4A:
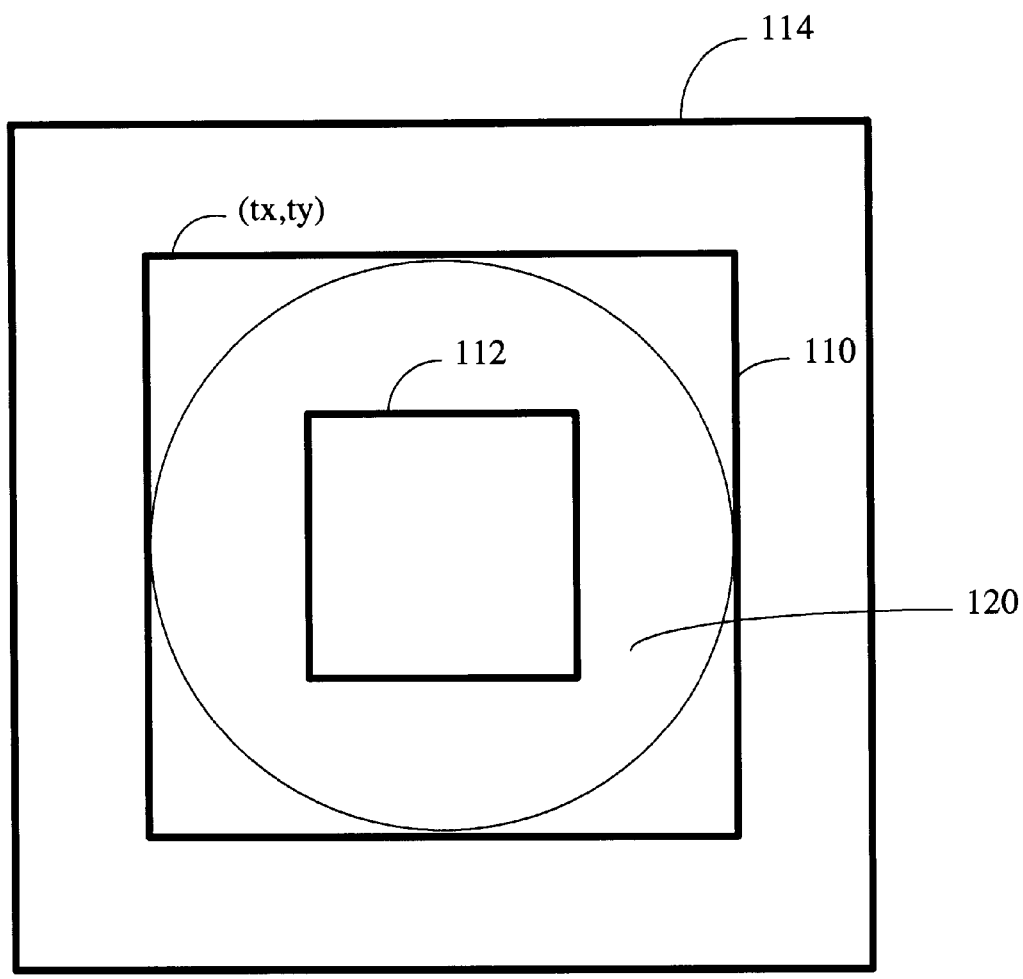
FIG. 4A is a drawing showing three train-time inspection windows, and a single known position of adhesive relative to the windows.

FIG. 2 is a flow chart showing the train-time portion of the invention. The steps performed during training are very similar to the steps performed for the run-time portion of the invention. Training is performed using a printed circuit board which has a region of adhesive present. Therefore, initially the user lays out a train-time window 110 around the adhesive region 120, as shown in FIGS. 3 and 4A. Given, the train-time location (tx, ty) 48 of the train-time window 110, the train-time sampling window 112 and the train-time inspection window 114 are computed (50), preferably in the same way as the run-time step (10) of FIG. 1, setting rx=tx, ry=ty, and the adhesive image region 120 being centered with respect to each of the windows 112, 114, and 116. Alternatively, the train-time sampling window 112 and the train-time inspection window 114 can be determined using a priori knowledge of the model adhesive region, such that the train-time sampling window 112 only includes pixels from the model adhesive region, and the train-time inspection window 114 includes all pixels of the model adhesive region.

Next, statistics in the train-time sampling window 112 are computed (55), just as in step (15), such as computing the mean gray-value. In an alternate embodiment, the standard deviation of the gray-values of the pixels within the train-time sampling window 112 can also be computed at this time, where the standard deviation can be used to determine two segmentation thresholds, as explained above in the case of run-time.

Next, the histogram for the inspection window 114 is computed (60), followed by computing (62) the high and low thresholds 66 using the area 64. Next, segmentation (68) of the adhesive region with respect to its background region is performed using the high and low thresholds, just as in step (28). It must be mentioned here that the area 64 used during train-time can be calculated mathematically using knowledge of the aperture used to dispense the adhesive, or graphically, such as by counting the number of pixels within the image region associated with the adhesive.

Following segmentation (68), a connectivity vision tool, such as a blob tool (for example, a blob tool sold by Cognex Corporation, Natick, Mass.) is run (70) to extract train-time features, such as the aspect ratio and moment of inertia of the adhesive region. Preferably, the area computed during train-time is used during run-time to compute the high and low thresholds, as explained above.

Alternatively, following segmentation, the segmented image can be saved for later use as a model template for template matching to accomplish presence/absence determination.

FIG. 3 shows a typical site for adhesive placement on a printed circuit board 140. The printed circuit board 140 has pads 100, and traces 130, each of which are metallic, and consequently are typically reflective. However, they may be dull, polished, or textured, or may be made from different metals (gold or tin, for example), thereby resulting in significant gray-level variations. Another factor is the board itself 140, which may exhibit different shades of green, yellow, or red. A typical adhesive region 120 is also shown with adhesive having being placed within the train-time window 110. The adhesive region 120 also may have a variety of shapes which are know prior to the adhesive dispensing process. In the example shown, the adhesive region 120 is assumed to be circular. The method of the invention can very easily accommodate non-circular shapes, such as polygons or elliptical shapes. The adhesive may be of different colors, such as yellow or red. However, for a particular batch of dispensing, even though the board color and glue color are ostensibly constant, there could nevertheless be significant color variations. For example, if the board color is green, there may be varying shades of green. In addition, the background color is affected by the presence/absence of features such as ground planes, masks, and so on. The adhesive itself may be of different shades for a variety of reasons: the dispensing mechanism may not be dispensing a constant amount of adhesive over time, the adhesive may be watered down by the operator, and so on.

FIG. 3 also shows a typical train-time window 110, referred to as T, that may be set by the user indicating the desired location of the adhesive. In a preferred embodiment, (tx, ty) are the upper left coordinates and (tw, th) are the width and height of T.

FIG. 4 shows the various windows 142, 145, and 148 that are formed at run-time. Typically, during runtime, the location of the expected run-time site (rx, ry) of the adhesive region is known to within a few pixels of the actual run-time site (ax, ay) of the adhesive. This is because the run-time coordinates (rx, ry) of the site are obtained by performing computations. In particular, the run-time coordinates are obtained using a coordinate transformation. More particularly, they are obtained by locating run-time global fiducials on the printed circuit board and train-time global fiducials on a model printed circuit board. Then, using knowledge of the position of the run-time global fiducials and the train-time global fiducials, a "pseudo-inverse rigid body transformation" (a combination of translation and rotation that preserves size and shape) is obtained that maps train-time coordinates into run-time coordinates. Then, this transformation is used to transform the train-time coordinates (tx, ty) of the adhesive to obtain the run-time coordinates of the adhesive. Preferably, more than two fiducials are used to perform the transformation. During run-time, the coordinates of the run-time window 142 R are (rx, ry), and the width and height of the run-time window 142 R are (rw, rh). (Note that tw=rw, and that th=rh.)

Now, given the run-time window R, the adhesive region may be in any of the positions shown in 150, where each position is indicated by a circle having a center at a different position within the window 142. Therefore, a larger window has to be constructed so as to ensure that the entire adhesive region falls within the window, regardless of its position. This is called the inspection window 145, (referred to as I). Let (ix, iy) be the coordinates of the inspection window I 145, and let (iw, ih) be the width and the height of the inspection window I 145. Then, ix=rx−dx; and iy=ry−dy, and further, iw=rw+2*dx, and ih=rh+2*dy. Here, dx and dy depend on the accuracy of the alignment system and the field of view. As mentioned earlier, the typical values are known to within a few pixels.

Another window that is formed during run-time is called the sampling window 148 (referred to as S). This window S 148 is guaranteed to always be completely within the adhesive region, if adhesive is present. The coordinates and dimensions of this window S 148 depend on (dx, dy), and also depend upon the shape of the adhesive region. It is necessary that the adhesive region be large enough to accommodate a minimum sampling window size. It is preferable to have the biggest sampling window possible. The minimum sampling window size is determined empirically.

Once the sampling window S 148 is constructed, it is guaranteed to be within the adhesive region at run-time, and therefore the statistics for the adhesive region are available at run-time, namely the mean gray-value within the sampling window S 148, and the standard deviation of the gray-values within the sampling window S 148.

The window in which the segmentation is to be performed is the inspection window I 145 which encompasses the entire range of possible positions of the adhesive region. In a preferred embodiment, the statistics obtained in the sampling window S 148 are used to accomplish segmentation.

Figure 5:
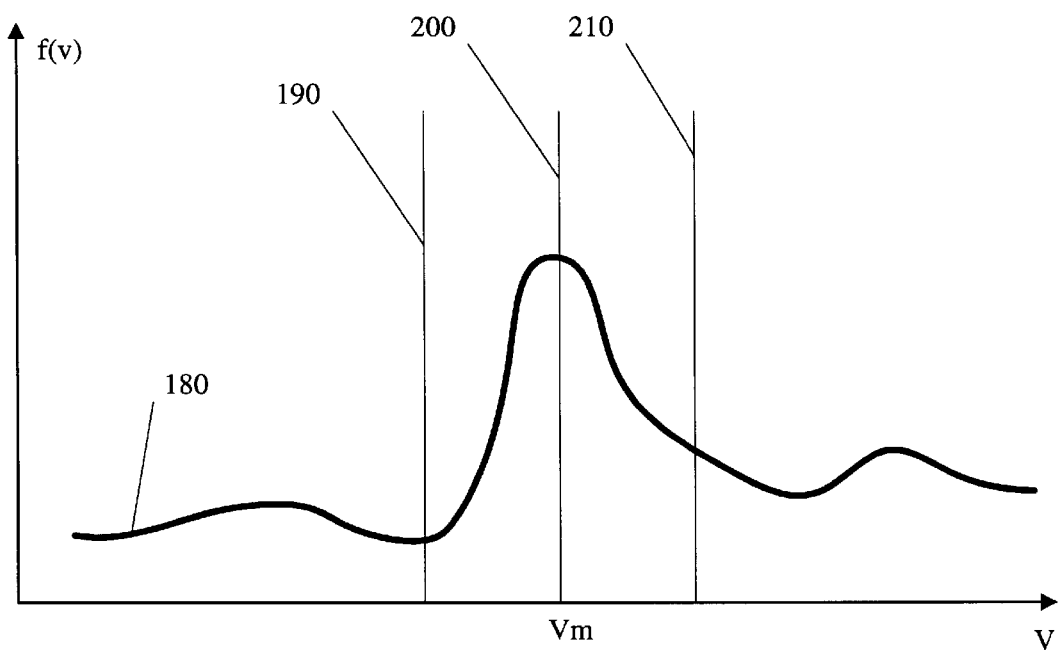
FIG. 5 is a gray-value histogram showing a low threshold, a high threshold, and a starting value along the gray-value axis of the histogram.

Referring to FIG. 5, segmentation begins by forming a gray-value histogram of the inspection window I 145. A gray-value histogram of an image is a function f(v) 180 that gives the frequency of occurrence f of each gray-value v in the image. If the gray-values v are quantized from 0 to n, then the histogram at a particular gray-value p (between 0 and n) is f(p). The mean gray-value $v_M$ obtained from the sampling window S 148 is used as a starting point 200 in the histogram of I. As recognized by the invention, the mean gray-value $v_M$ is highly correlated to the gray-level of the pixels in the window I 145 which correspond to adhesive. This is because the mean gray-value $v_M$ was derived from the sampling window S which was completely within an adhesive region. Typically the adhesive gray-values change slowly over the adhesive region, and therefore, as recognized by the invention, it can be assumed that the gray-values near the mean gray-value $v_M$ also correspond to adhesive. Therefore, a preferred way to determine the high and low segmentation thresholds is to perform a "histogram walk" starting at the mean gray-value $v_M$ that moves the high and low thresholds until the area (cumulative number of pixels) enclosed by the high and low thresholds and under the histogram curve equals the area (number of pixels) of the adhesive region known at train-time. This provides two gray level values called a low segmentation threshold 190 and a high segmentation threshold 210. Once, the two segmentation thresholds are obtained, they can easily be used to perform segmentation: all the gray-values that fall within the two segmentation thresholds (with the threshold values inclusive) are designated as adhesive (or more generally, as object), and all other gray-values are designated as background. In an alternate embodiment, the standard deviation of the sampling window, which is another characteristic of the model image of the adhesive region, can be used to obtain the two segmentation values.

In case of detecting the presence/absence of adhesive, an additional step of shape matching is employed. As discussed above, if the adhesive is present then the adhesive is segmented from the background. However, if the adhesive is absent, then the segmentation of the image is random. The area beneath the sampling window 148 typically is the area of the printed circuit board (if adhesive is absent), and therefore, the gray-values corresponding to the board get segmented. The shape of the region segmented is random, and is therefore different from the shape of the adhesive, which is regular.

The shape thus segmented can be compared to the expected shape of the adhesive can be done by using template matching, such as by doing straight-forward binary correlation. This approach, however, may be too computationally expensive.

In a preferred embodiment of the invention, geometric features are compared. At train-time, geometric features of the adhesive, such as the area, perimeter, principle moments of inertia, and elongation (ratio of the principle moments of inertia) of the adhesive region, are computed. The geometric features are obtained by training on a site with adhesive and running a Connectivity/Blob vision tool on the segmented image, and then computing the various geometric features of the segmented adhesive. The same geometric features are derived for the object under inspection at run-time.

Next, an error measure is computed as follows:

$$E = \Sigma_{all\ i} W_i^* [abs(r_i - t_i)] \qquad \text{Equation 1}$$

where E is the cumulative error, $w_i$ is the weight of the ith feature, $t_i$ is the train-time value of the ith feature, and $r_i$ is the run time value of the ith feature. An error threshold $E_{threshold}$ is used which is used to decide if the shape segmented is adhesive or not. $E_{threshold}$ is a scalar value that is obtained empirically, based on the application. One way to obtain $E_{threshold}$ empirically I to inspect sites having adhesive present and not present, determine E in both cases, and selecting an $E_{threshold}$ that maximally distinguishes between the two cases. For example, if two clusters of data points in E are found, $E_{threshold}$ is preferably equidistant between the mean of each cluster. The following criteria is used to make a decision:

if (E<$E_{threshold}$), then Adhesive is present, else, Adhesive is absent.

Other modifications and implementations will occur to those skilled in the art without departing from the spirit and the scope of the invention as claimed. Accordingly, the above description is not intended to limit the invention except as indicated in the following claims.

What is claimed is:

1. A method for segmenting a run-time image having at least a background region and a candidate object region, the method comprising the steps of:

acquiring knowledge of a characteristic of a model object region in a model image;

constructing a sampling window for acquiring gray-value statistics on a candidate object region in said run-time image;

acquiring gray-value statistics on a candidate object region in said run-time image;

creating a gray-value histogram based on said run-time image;

using said gray-value statistics on said candidate object region, and said knowledge of said characteristic of said model object region, to determine a high threshold and a low threshold;

comparing each pixel of said run-time image with at least one of said high threshold and said low threshold to provide a binary comparison image including a plurality of binary comparison values, each binary comparison value indicating whether each said pixel corresponds to said candidate object region.

2. The method of claim 1, said characteristic of said model object region being the area of said model object region.

3. The method of claim 1, said characteristic of said model object region being the standard deviation of the gray-value of pixels within said model object region.

4. The method of claim 1, further including the steps of:

performing connectivity analysis on said binary comparison image to provide run-time geometric object features;

performing connectivity analysis on a train-time binary comparison image to provide train-time geometric object features; and comparing said run-time geometric object features with said train-time geometric object features to determine presence/absence of said object.

5. The method of claim 1, further including the steps of:

using template matching to compare said binary comparison image with a train-time comparison image so as to determine presence/absence of said object.

6. An apparatus for segmenting a run-time image having at least a background region and a candidate object region, the method comprising the steps of:

means for acquiring knowledge of a characteristic of a model object region in a model image;

means for constructing a sampling window for acquiring gray-value statistics on a candidate object region in said run-time image;

means for acquiring gray-value statistics on a candidate object region in said run-time image;

means for creating a gray-value histogram based on said run-time image;

means for using said gray-value statistics on said candidate object region, and said knowledge of said characteristic of said model object region, to determine a high threshold and a low threshold;

means for comparing each pixel of said run-time image with at least one of said high threshold and said low threshold to provide a binary comparison image including a plurality of binary comparison values, each binary comparison value indicating whether each said pixel corresponds to said candidate object region.

7. The apparatus of claim 6, said characteristic of said model object region being the area of said model object region.

8. The apparatus of claim 6, said characteristic of said model object region being the standard deviation of the gray-value of pixels within said model object region.

9. The apparatus of claim 6, further including the steps of:

means for performing connectivity analysis on said binary comparison image to provide run-time geometric object features;

means for performing connectivity analysis on a train-time binary comparison image to provide train-time geometric object features; and means for comparing said run-time geometric object features with said train-time geometric object features to determine presence/absence of said object.

10. The apparatus of claim 6, further including the steps of:

means for using template matching to compare said binary comparison image with a train-time comparison image so as to determine presence/absence of said object.

* * * * *